United States Patent [19]
Olshansky et al.

[11] Patent Number: 5,119,039
[45] Date of Patent: Jun. 2, 1992

[54] SEMICONDUCTOR OPTICAL AMPLIFIER WITH WIDEBAND ELECTRICAL RESPONSE

[75] Inventors: Robert Olshansky, Wayland; Gerald R. Joyce, Watertown, both of Mass.

[73] Assignee: GTE Laboratories Incorporated, Waltham, Mass.

[21] Appl. No.: 636,526

[22] Filed: Dec. 31, 1990

[51] Int. Cl.⁵ .................................................. H01S 3/08
[52] U.S. Cl. ..................................... 359/346; 372/49; 357/30
[58] Field of Search ..................... 330/4.3; 372/49, 46, 372/81, 99; 357/17, 30

[56] References Cited

U.S. PATENT DOCUMENTS

| | | | |
|---|---|---|---|
| 4,847,844 | 7/1989 | Noda et al. | 372/46 |
| 4,860,276 | 8/1989 | Ukita et al. | 369/119 |
| 4,879,761 | 11/1989 | Webb | 455/601 |
| 4,965,525 | 10/1990 | Zab | 330/4.3 |

OTHER PUBLICATIONS

Olshansky et al; "Frequency Response . . . Lasers"; Sep. 1987; IEEE J.Q.E., vol. QE-23, pp. 1410-1418.
Su et al.; "17 GHz Direct Modulation . . . Lasers"; Apr. 10, 1985; Proc. SPIE Int Soc. Opt Eng.; vol. 545, pp. 10-13.
N. A. Olsson, "Lightwave Systems with Optical Amplifiers", Journal of Lightwave Technology, vol. 7, Jul. 1989 pp. 1071-1082.
J. Mellis, "Direct Optical Phase Modulation in Semiconductor Laser Amplifier", Electronics Letters, May 1989, vol. 25, No. 10, pp. 679-680.
G. Grosskopf et al., "Characteristics of Semiconductor Laser Optical Amplifier as Phase Modulator", Electronic Letters, Aug. 1989, vol. 25, No. 17, pp. 1188-1189.
M. Ikeda, "Signal Monitoring Characteristics for Laser Diode Optical Switches", Journal of Lightwave Technology, vol. LT-3, No. 4, Aug. 1985, pp. 909-913.
D. J. Malyon et al., "Laser Amplifier Control in 280 Mbit/s Optical Transmission System", Electronic Letters, vol. 25, No. 3, pp. 235-236, Feb. 1989.
M. Gustavsson et al., "Traveling Wave Semiconductor Laser Amplifier Detectors", Journal of Lightwave Technology, vol. 8, pp. 610-617, Apr. 1990.

Primary Examiner—Nelson Moskowitz
Attorney, Agent, or Firm—Lawrence E. Monks

[57] ABSTRACT

A semiconductor optical amplifier includes an active region having facets at opposite ends thereof which define an optical cavity having maximum optical gain at a gain peak wavelength $\lambda_{pk}$. An antireflection coating on each of the facets has a wavelength $\lambda_{min}$ of minimum reflectivity that is separated in wavelength from the gain peak wavelength, preferably by about 5 to 30 nanometers. The optical amplifier is operated at a bias current greater than a stimulated emission threshold bias current of the device. The input optical signal has a wavelength at or near the wavelength $\lambda_{min}$ of minimum reflectivity of the antireflection coatings. The optical amplifier has an electrical bandwidth on the order of 1 to 10 GHz.

14 Claims, 5 Drawing Sheets

SEMICONDUCTOR OPTICAL AMPLIFIER WITH WIDEBAND ELECTRICAL RESPONSE

FIELD OF THE INVENTION

This invention relates to semiconductor optical amplifiers and, more particularly, to semiconductor optical amplifiers which have an electrical bandwidth on the order of 1 to 10 GHz.

BACKGROUND OF THE INVENTION

Optical amplifiers provide the capability to directly amplify an optical signal without first converting the optical signal to an electrical signal. Optical amplifiers are useful as repeaters and preamplifiers in optical communication systems. A semiconductor optical amplifier is typically constructed as a modified laser diode. An optical cavity is fabricated in a substrate with facets which act as mirrors on opposite ends of the optical cavity. When the device is appropriately biased, the optical cavity has optical gain. In order to provide operation as an amplifier rather than a laser, antireflection coatings are applied to the facets, or the facets are oriented at an angle relative to the optical axis of the cavity. An input optical signal is injected through one of the facets, is amplified in the optical cavity and passes through the facet at the opposite end of the optical cavity. Optical amplifiers are described generally by N. A. Olsson in "Lightwave Systems With Optical Amplifiers", *Journal of Lightwave Technology*, Vol. 7, No. 7, July 1989, pages 1071-1082.

Uses of optical amplifiers for applications other than or in addition to amplification have been proposed. Phase modulation of optical signals with semiconductor optical amplifiers is disclosed by J. Mellis in "Direct Optical Phase Modulation in Semiconductor Laser Amplifier", *Electronics Letters*, May 1989, Vol. 25, No. 10, pages 679-680 and by G. Grosskopf et al in "Characteristics of Semiconductor Laser Optical Amplifier as Phase Modulator", *Electronics Letters*, August 1989, Vol. 25, No. 17, pages 1188-1189. A modulation signal is combined with the bias current to effect phase modulation of the optical signal. Signal monitoring and control applications of semiconductor optical amplifiers are disclosed by M. Ikeda in "Signal Monitoring Characteristics for Laser Diode Optical Switches", *Journal of Lightwave Technology*, Vol. LT 3, No. 4, August 1985, pages 909-913; D. J. Malyon et al in "Laser Amplifier Control in 280 Mbit/s Optical Transmission System", *Electronics Letters*, February 1989, Vol. 25, No. 3, pages 235-236 and M. Gustavsson et al "Traveling Wave Semiconductor Laser Amplifier Detectors", *Journal of Lightwave Technology*, Vol. 8, pages 610-617, April 1990. In signal monitoring and control applications of optical amplifiers, a modulated optical signal injected into the optical cavity causes a change in the diode voltage, which can be measured at the current input terminals. Applications of semiconductor optical amplifiers as optical mixers, frequency converters and electrooptic mixers have also been proposed.

In all of these applications, the electrical response and the 3 dB electrical bandwidth of the optical amplifier are determined by the ability of the carrier density population N to respond to either an optical signal injected into the amplifier or an electrical signal applied to the amplifier current input terminals. In traveling wave optical amplifiers, the frequency response of the device is determined by the ability of the injected carrier population N to respond to the modulating signal. For a device operated well below saturation and for a typical carrier lifetime of 0.3 nanoseconds, the bandwidth is about 500 MHz. For a device operated at saturation, the bandwidth is increased to 1 GHz. For traveling wave optical amplifiers used as modulators, photodetectors, mixers or frequency converters, restriction of the bandwidth to the range of 500 MHz to 1 GHz is a serious limitation.

It is a general object of the present invention to provide improved optical communication systems.

It is another object of the present invention to provide improved semiconductor optical amplifiers.

It is a further object of the present invention to provide semiconductor optical amplifiers having a very wide electrical bandwidth.

It is yet another object of the present invention to provide a semiconductor optical amplifier capable of operation as a wide bandwidth optical phase modulator or optical signal monitor.

SUMMARY OF THE INVENTION

According to the present invention, these and other objects and advantages are achieved in a semiconductor optical amplifier having a wide electrical bandwidth. The amplifier comprises a semiconductor diode including an active region, upper and lower cladding layers and a cap layer formed in a semiconductor substrate. The active region has facets at opposite ends thereof which define an optical cavity. The optical cavity has maximum optical gain at a gain peak wavelength $\lambda_{pk}$. The optical amplifier further includes an antireflection coating on each of the facets, bias current means for supplying to the semiconductor diode a bias current greater than a stimulated emission threshold bias current of the semiconductor diode, and means for injecting an input optical signal into the optical cavity through one of the facets. Preferably, the antireflection coatings have a wavelength $\lambda_{min}$ of minimum reflectivity that is separated from the gain peak wavelength $\lambda_{pk}$, and the input optical signal has a wavelength at or near the wavelength $\lambda_{min}$ of minimum reflectivity of the antireflection coatings.

The gain peak wavelength $\lambda_{pk}$ is separated from the wavelength $\lambda_{min}$ of minimum reflectivity such that the reflectivity of the antireflection coating at the gain peak wavelength is about $10^{-3}$ to $10^{-4}$. Preferably, the gain peak wavelength $\lambda_{pk}$ is separated from the wavelength $\lambda_{min}$ of minimum reflectivity by about 5 to 30 nanometers. Preferably, the bias current means supplies to the semiconductor diode a bias current that is about one to four times greater than the stimulated emission threshold bias current. When the semiconductor optical amplifier of the invention is used as an optical modulator or an optical signal monitor, its electrical bandwidth is on the order of about 1 to 10 GHz.

According to another aspect of the invention there is provided a method of operating a semiconductor optical amplifier. The method comprises the steps of providing a semiconductor optical cavity having facets at opposite ends thereof, the facets having an antireflection coating thereon, supplying to the optical cavity a bias current greater than a stimulated emission threshold bias current of the optical cavity, and injecting an input optical signal into the optical cavity through one of the facets. Preferably, the antireflection coatings have a wavelength $\lambda_{min}$ of minimum reflectivity that is separated from a gain peak wavelength $\lambda_{pk}$ of maximum gain of the optical cavity, and the input optical signal has a wavelength at or near the wavelength $\lambda_{min}$ of minimum reflectivity of the antireflection coatings.

BRIEF DESCRIPTION OF THE DRAWINGS

For a better understanding of the present invention, together with other and further objects, advantages and capabilities thereof, reference is made to the accompanying drawings which are incorporated herein by reference and in which.

DETAILED DESCRIPTION OF THE INVENTION

Figure 1A:
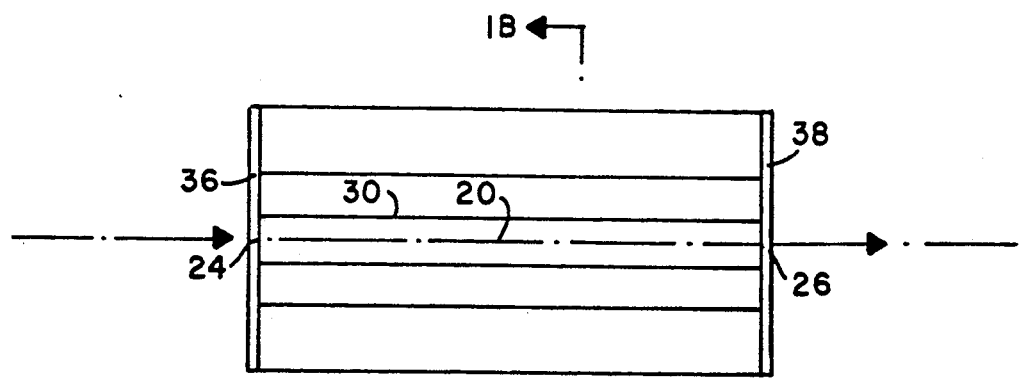
FIGS. 1A and 1B are simplified illustrations of a semiconductor optical amplifier.
Figure 1B:
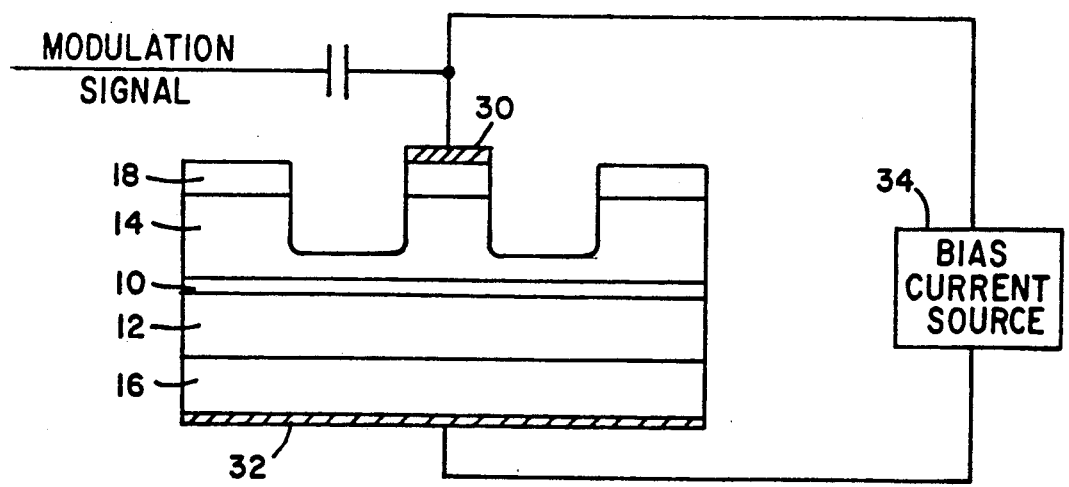

A semiconductor optical amplifier in accordance with the invention is shown in FIGS. 1A and 1B. The optical amplifier includes an active region 10, a lower cladding layer 12, an upper cladding layer 14, a substrate 16 and a cap layer 18. Preferably, the active region 10 comprises InGaAsP, the lower cladding layer 12 comprises n-InP, the upper cladding layer 14 comprises p-InP, the substrate 16 comprises n-InP, and the cap layer 18 comprises p-InGaAsP. The active region 10 is elongated in the direction of an optical axis 20 and has facets 24 and 26 at opposite ends. The facets 24 and 26 function as mirrors. The active region 10 between facets 24 and 26 comprises an optical cavity.

The active region 10 and the substrate 12 form a semiconductor diode. Electrodes 30 and 32 on opposite sides of active region 10 permit the device to be biased at a predetermined bias current by a bias current source 34. When the facets 24 and 26 have reflectivities on the order 32% and an appropriate bias current is supplied, the device acts as a laser diode and generates coherent optical energy. In order to operate the device as an optical amplifier, the reflectivity of the facets is reduced by two or three orders of magnitude. This can be accomplished by applying antireflection coatings 36 and 38 to facets 24 and 26, respectively, and/or by tilting the facets with respect to their normal orientation perpendicular to optical axis 20. In operation as an amplifier, optical energy is injected through one of the facets into the optical cavity, is optically amplified in the active region and passes through the other facet without reflection. Techniques for construction of semiconductor optical amplifiers are generally known in the art and are described in the aforementioned publication by N.A. Olsson, which is hereby incorporated by reference.

The antireflection coatings used in semiconductor optical amplifiers have a reflectivity that is a sharp function of the optical wavelength, and have a wavelength $\lambda_{min}$ at which minimum reflectivity occurs. The optical cavity of the amplifier has a gain that is a function of wavelength. In a conventional optical amplifier, the wavelength $\lambda_{min}$ of minimum reflectivity of the antireflection coating is selected to match the gain peak wavelength $\lambda_{pk}$ of the optical cavity. This insures that high gain will be obtained and that laser operation will be avoided. The conventional optical amplifier is biased at a bias current less than the stimulated emission threshold bias current.

As discussed above, one of the drawbacks of conventional semiconductor optical amplifiers is that the electrical bandwidth is limited to about 500 MHz to 1 GHz. The relatively narrow bandwidth limits the applications of the optical amplifier as an optical phase modulator, optical signal monitor or the like. In accordance with the present invention, the optical amplifier is operated in a manner which provides a very wide electrical bandwidth. The optical amplifier of the present invention is biased at a bias current greater than the stimulated emission threshold bias current of the device. Preferably, the bias current is on the order of one to four times the threshold bias current. The desired bias current is typically on the order of 0 to 100 milliamps greater than the threshold bias current, which is typically on the order of 10 to 50 milliamps. Although the optical amplifier exhibits higher gain ripple when operated at a high bias current, the electrical bandwidth is greatly increased.

In a preferred embodiment, the characteristics of the antireflection coatings 36 and 38 are selected such that the wavelength $\lambda_{min}$ of minimum reflectivity is separated from the gain peak wavelength $\lambda_{pk}$ by a few nanometers. As a result, the reflectivity of the facets at the gain peak wavelength is greater than in conventional optical amplifiers, but is less than the reflectivity required for laser operation. Preferably, the reflectivity of the facets at the gain peak wavelength $\lambda_{pk}$ is in a range of about $10^{-3}$ to $10^{-4}$. This can be achieved by a separation between the gain peak wavelength $\lambda_{pk}$ and the wavelength $\lambda_{min}$ of minimum reflectivity of the antireflection coatings on the order of about 5 to 30 nanometers. Preferably, the gain peak wavelength $\lambda_{pk}$ is separated from the wavelength $\lambda_{min}$ of minimum reflectivity such that the reflectivity of the antireflection coating at the gain peak wavelength is about 2 to 100 times greater than the minimum reflectivity. The input optical signal to the optical amplifier is at or near the wavelength $\lambda_{min}$ of minimum reflectivity of the antireflection coatings 36 and 38. An optical amplifier operated in this manner exhibits an extremely wide electrical bandwidth on the order of 1 to 10 GHz.

In applications of the optical amplifier as an optical phase modulator, photodetector or signal monitor, the electrical response of the optical amplifier is determined by the ability of the carrier density population N to respond to either an optical signal $\delta S(\omega)$ coupled into the amplifier or an electrical signal $\delta I(\omega)$ applied to the amplifier electrodes. In traveling wave optical amplifiers, the frequency response of the device is determined by the ability of the injected carrier population to respond to the modulating signal. In conventional optical amplifiers, the response of the carrier density population is given as $$\delta N\omega = 1/\{(1+P_{out}/P_{sat})^2+(\omega\tau_c)^2\}^{\frac{1}{2}} \quad (1)$$

where $P_{out}$ is the output power, $P_{sat}$ is the saturated output power of the amplifier and $\tau_c$ is the carrier lifetime. The 3dB' bandwidth BW of the device is given as $$BW=(1+P_{out}/P_{sat})/(2\pi\tau_c) \quad (2)$$

For a conventional device operated well below saturation, and for a typical carrier lifetime of 0.3 nanoseconds, the bandwidth is 500 MHz. For a device operated at saturation ($P_{out}=P_{sat}$), the bandwidth is increased to 1 GHz.

As discussed above, the semiconductor optical amplifier of the present invention utilizes an antireflection coating having a wavelength $\lambda_{min}$ of minimum reflectivity that is separated by several nanometers from the gain peak wavelength $\lambda_{pk}$. When the optical amplifier of the invention is operated at high bias current, there is a strong stimulated emission at $\lambda_{pk}$ because this is the wavelength of maximum gain, and the facet reflectivity is not particularly low. Thus, the device operates in a laser-like fashion at this wavelength and produces stimulated emission with output power $P_{st}$. The carrier density population exhibits the characteristic relaxation oscillation resonance at a frequency $f_{lo}$ $$f_{lo} = \tfrac{1}{2}\pi\{dG/dN\alpha S_{st}\}^{\tfrac{1}{2}} \qquad (3)$$

where $dG/dN$ is the differential gain, $\alpha$ is the cavity loss at $\lambda_{st}$ and $S_{st}$ is the photon density in the cavity. As in typical lasers, the resonance frequency is in the range of 1-10 GHz depending on the parameters and the stimulated output power of the device.

When an electrical signal $\delta I(\omega)$ modulated at a frequency $\omega$ is applied to the device or an optical sign $P_0 + \delta P(\omega)$ is injected into the cavity with an intensity modulation component at frequency $\omega$, then the carrier density responds with the characteristic behavior $$\delta N(\omega) \propto 1/\{(\omega-\omega_0)^2 + \omega^2\Gamma^2\} \qquad (4)$$

where $\delta N(\omega)$ is the variation in the injected carrier density at frequency $\omega$, $\omega_o$ is the resonance frequency and $\Gamma$ is the damping factor. Although the device of the invention has many of the characteristic features of a laser, the facet reflectivity is very low at optical wavelengths near the wavelength $\lambda_{min}$ of minimum reflectivity, the Fabry-Perot cavity resonances are strongly suppressed, and the device acts as a linear amplifier with gain G where $$G = exp(qL) \qquad (5)$$

where g is the modal gain per unit length at $\lambda_{min}$, and L is the cavity length. When an optical signal $P_{in}$ at wavelength $\lambda_{min}$ is launched into the cavity, then the output optical signal power is given as $$P_{out} = G\,P_{in} \qquad (6)$$

Figure 2:
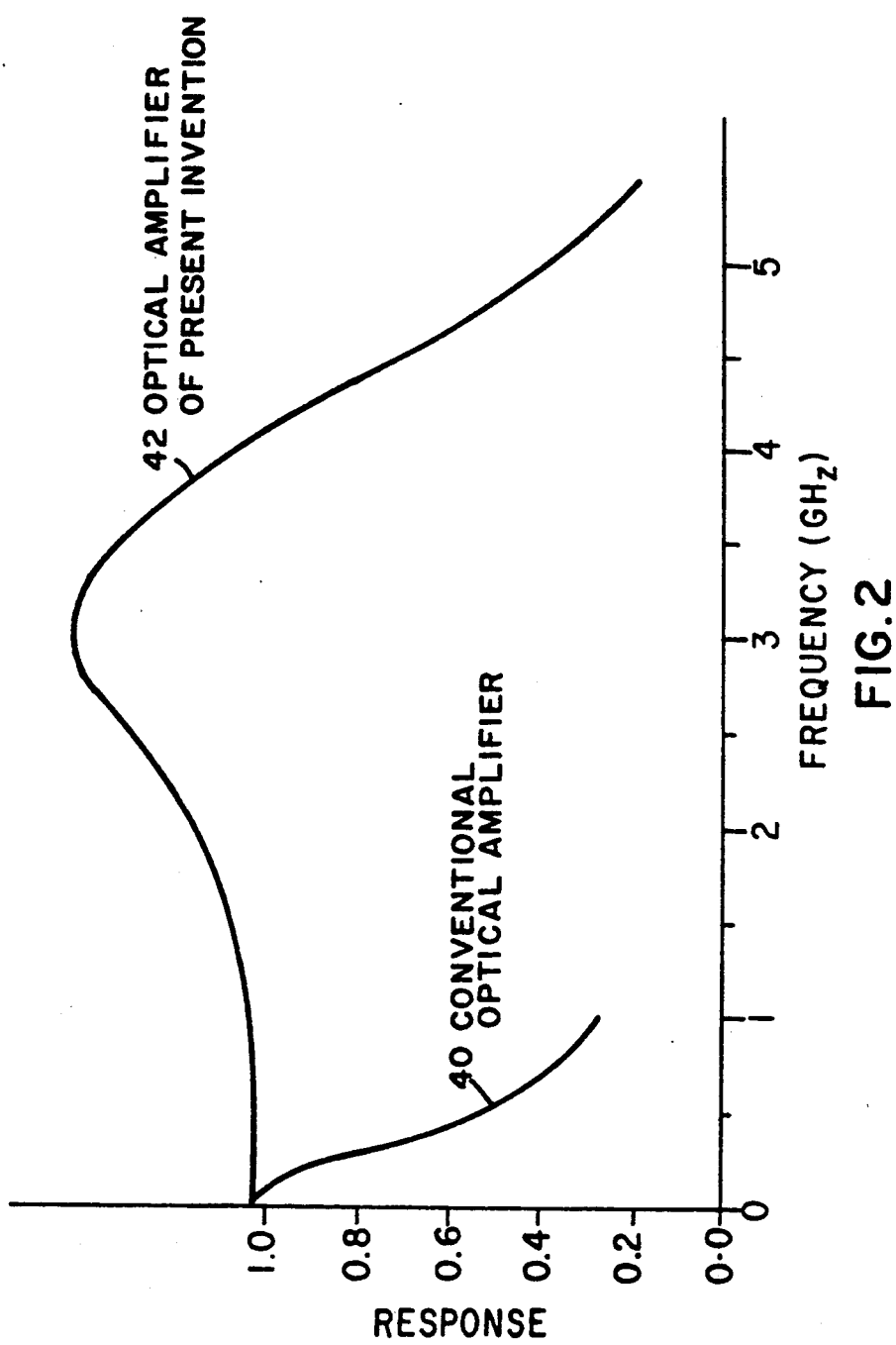
FIG. 2 is a graph of the electrical frequency responses of a prior art optical amplifier and an optical amplifier in accordance with the present invention.

Unlike the conventional optical amplifier having a frequency response given by Equation (1), the device of the present invention operates with a laser-like high frequency response given by Equation (4). The frequency response of a conventional optical amplifier is shown in FIG. 2 as curve 40. As used herein, frequency response refers the intensity or phase modulation of an optical carrier as a function of modulation frequency applied to the amplifier electrode. The frequency response of an optical amplifier in accordance with the present invention is shown in FIG. 2 as curve 42.

Figure 3:
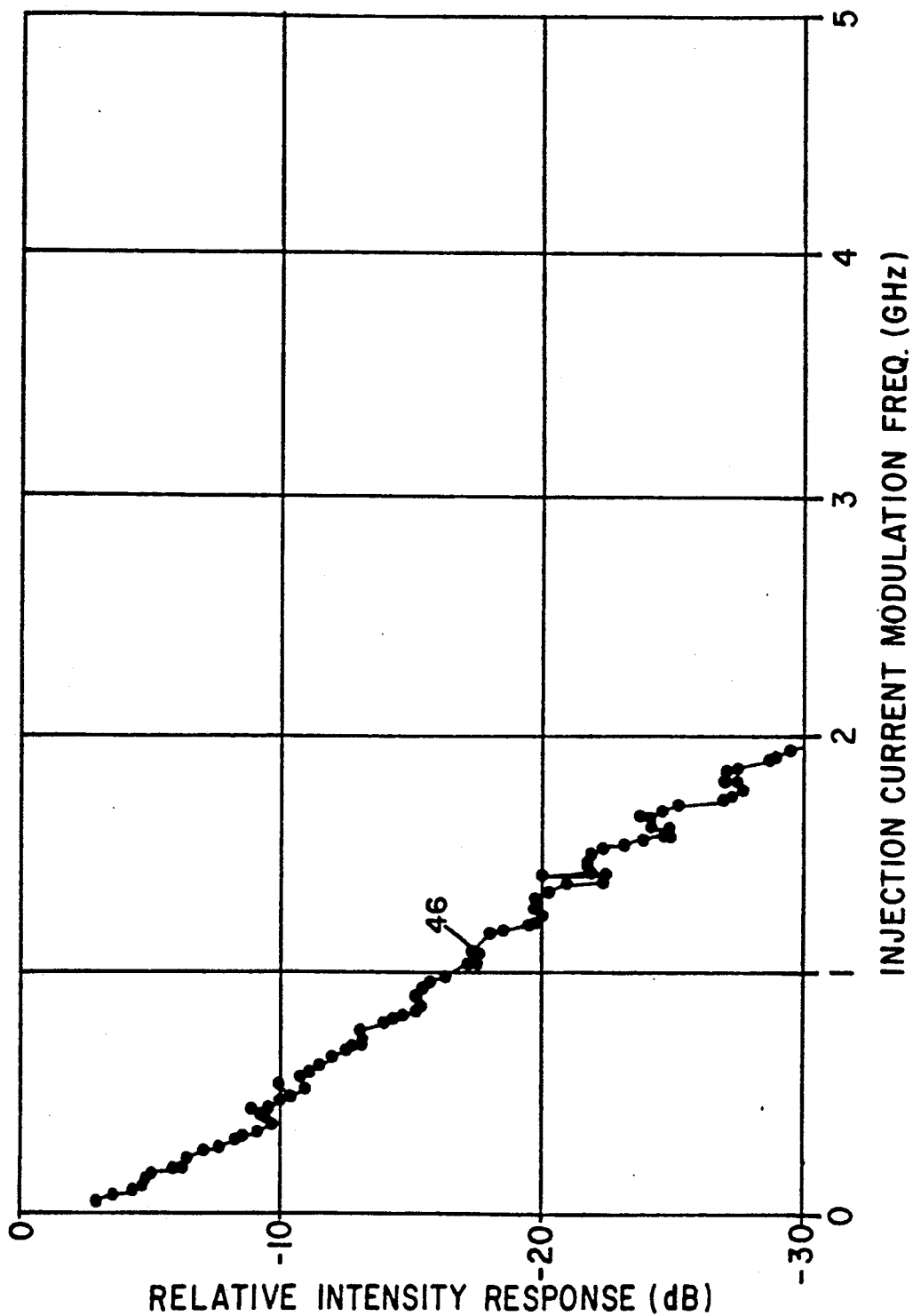
FIG. 3 is a graph of the electrical frequency response of a semiconductor optical amplifier in accordance with the prior art.

The intensity modulation frequency response of a semiconductor optical amplifier operated in conventional manner with low bias and less than 3 dB gain ripple is shown as curve 46 in FIG. 3. Curve 46 was obtained with a conventional buried heterostructure semiconductor laser amplifier with antireflective coatings applied to the facets. The amplifier was operated at 26 milliamps bias, which resulted in 3dB gain ripple and 10dB chip gain. Curve 46 shows that the frequency response decreases rapidly and has fallen by 10 dB at 500 MHz.

Figure 4:
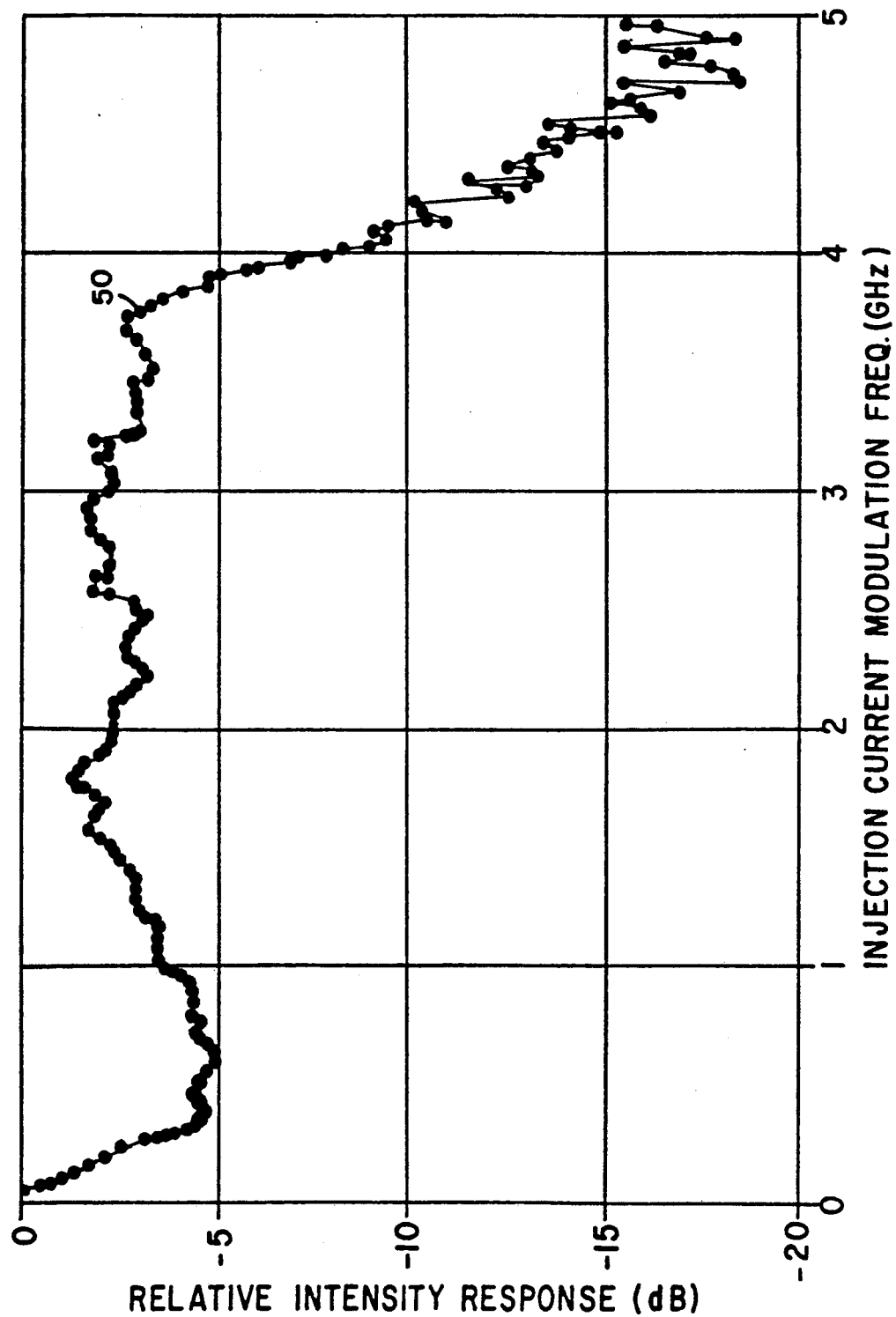
FIG. 4 is a graph of the electrical frequency response of a semiconductor optical amplifier in accordance with the present invention.

The intensity modulation frequency response of the same semiconductor optical amplifier used to obtain FIG. 3 operating at a high bias current level is shown as curve 50 in FIG. 4. Curve 50 was taken under the conditions of 56 milliamps bias current, 10dB gain ripple and 18dB chip gain. Curve 50 shows that the amplifier an excellent response at frequencies as high as 3.5 GHz.

Figure 5:
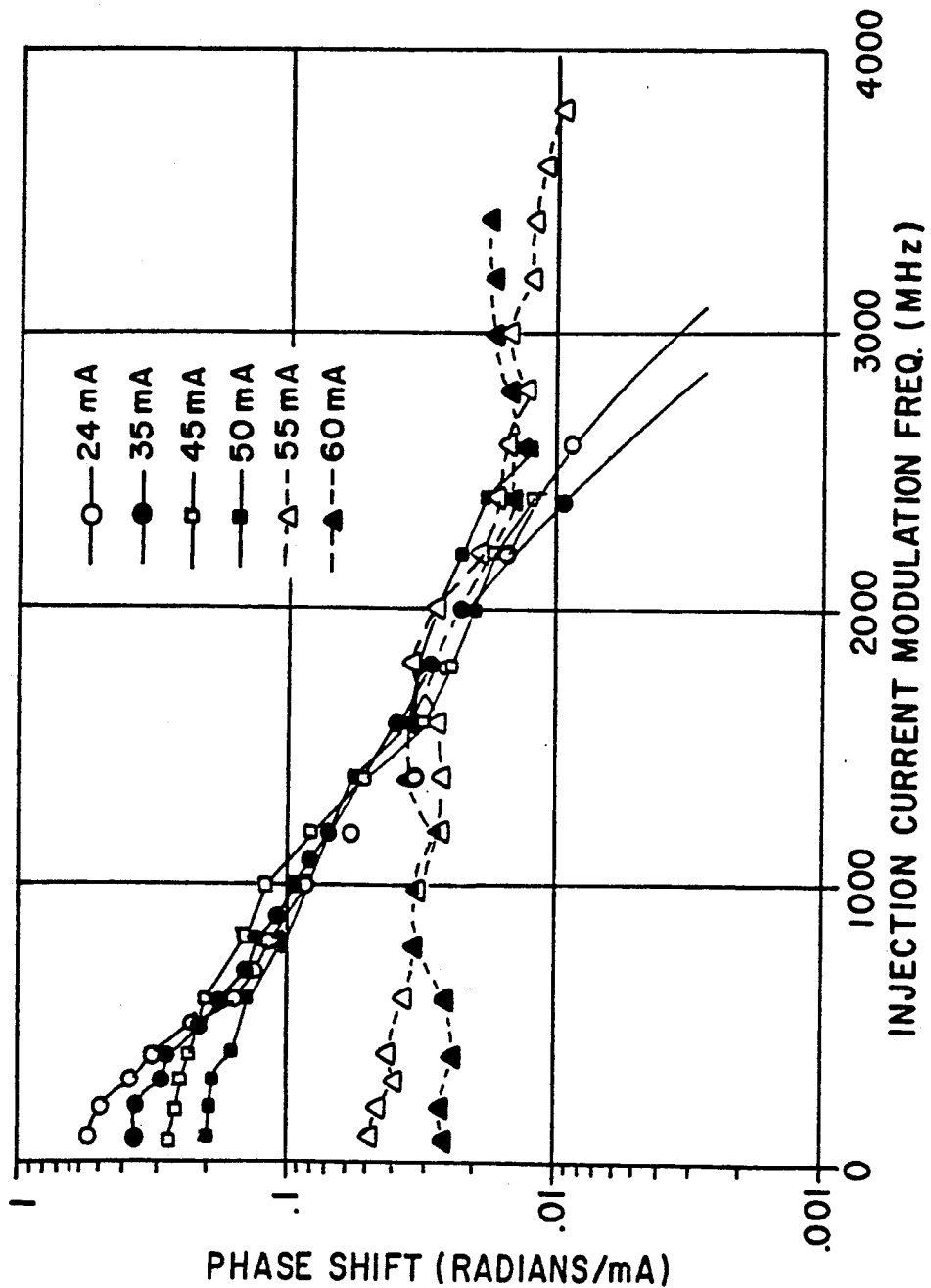
FIG. 5 is a graph of the phase modulation of a semiconductor optical amplifier as a function of modulation frequency, for different bias current levels.

Measurements of the phase modulation index of an optical amplifier in radians normalized to the amplitude of the drive signal in milliamps are plotted as a function of modulation frequency in FIG. 5 for different DC bias currents. The data plotted in FIG. 5 was taken with the same semiconductor optical amplifier used to obtain FIGS. 3 and 4 operating at bias currents ranging from 24 to 60 milliamps. At bias currents of 55 milliamps and 60 milliamps, the optical amplifier exhibits a relatively flat phase response from DC to 3.5 GHz.

While there have been shown and described what are at present considered the preferred embodiments of the present invention, it will be obvious to those skilled in the art that various changes and modifications may be made therein without departing from the scope of the invention as defined by the appended claims.

What is claimed is:

1. A semiconductor optical amplifier comprising:
   an active region, upper and lower cladding layers and a cap layer formed in a semiconductor substrate, said active region and said substrate defining a semiconductor diode, said active region having facets at opposite ends thereof which define an optical cavity, said optical cavity having maximum optical gain at a gain peak wavelength $\lambda_{pk}$;
   an antireflection coating on each of said facets, said antireflection coatings having a wavelength $\lambda_{min}$ of minimum reflectivity that is separated in wavelength from said gain peak wavelength;
   bias current means for supplying to said semiconductor diode a bias current greater than a stimulated emission threshold bias current of said semiconductor diode; and
   means for injecting an input optical signal into said optical cavity through one of said facets, said input optical signal having a wavelength at or near the wavelength $\lambda_{min}$ of minimum reflectivity of said antireflection coatings.

2. A semiconductor optical amplifier as defined in claim 1 wherein the gain peak wavelength $\lambda_{pk}$ is separated from the wavelength $\lambda_{min}$ of minimum reflectivity by about 5 to 30 nanometers.

3. A semiconductor optical amplifier as defined in claim 1 wherein the gain peak wavelength $\lambda_{pk}$ is separated from the wavelength $\lambda_{min}$ of minimum reflectivity such that the reflectivity of the antireflection coating at the gain peak wavelength is about 2 to 100 times greater than the minimum reflectivity.

4. A semiconductor optical amplifier as defined in claim 1 further including means for modulating said bias current with a modulation signal such that an optical signal passing through the amplifier is phase modulated by said modulation signal.

5. A semiconductor optical amplifier as defined in claim 1 wherein said substrate comprises InP and said active region comprises InGaAsP.

6. A semiconductor optical amplifier as defined in claim 1 wherein said bias current means supplies to said semiconductor diode a bias current that is about one to four times greater than the stimulated emission threshold bias current.

7. A semiconductor optical amplifier as defined in claim 1 wherein the reflectivity of the antireflection coating at the gain peak wavelength $\lambda_{pk}$ is about $10^{-3}$ to $10^{-4}$.

8. A semiconductor optical amplifier as defined in claim 1 wherein said input optical signal is intensity modulated and further including means connected to said semiconductor diode for providing an electrical signal representative of the intensity modulation of said input optical signal.

9. A method of operating a semiconductor optical amplifier comprising the steps of:
providing an optical cavity having facets at opposite ends thereof, said facets having antireflection coatings thereon, said antireflection coatings having a wavelength $\lambda_{min}$ of minimum reflectivity that is separated from a gain peak wavelength $\lambda_{pk}$ of maximum optical gain of said optical cavity;
supplying to said optical cavity a bias current greater than a stimulated emission threshold bias current of said optical cavity; and
injecting an input optical signal into said optical cavity through one of said facets, said input optical signal having a wavelength at substantially the wavelength $\lambda_{min}$ of minimum reflectivity of said antireflection coatings.

10. A method as defined in claim 9 wherein the step of supplying a bias current includes supplying a bias current that is about one to four times greater than the stimulated emission threshold bias current.

11. A method as defined in claim 9 wherein the step of providing an optical cavity includes separating the gain peak wavelength $\lambda_{pk}$ from the wavelength $\lambda_{min}$ of minimum reflectivity by about 5 to 30 nanometers.

12. A semiconductor optical amplifier comprising:
an active region, upper and lower cladding layers and a cap layer formed in a semiconductor substrate, said active region and said substrate defining a semiconductor diode, said active region having facets at opposite ends thereof which define an optical cavity having maximum optical gain at a gain peak wavelength $\lambda_{pk}$, each facet having an antireflection coating thereon, said antireflection coatings having a wavelength $\lambda_{min}$ of minimum reflectivity that is separated in wavelength from said gain peak wavelength;
bias current means for supplying to said semiconductor diode a bias current greater than a stimulated emission threshold bias current of said semiconductor diode; and
means for injecting an input optical signal into said optical cavity through one of said facets.

13. A semiconductor optical amplifier as defined in claim 12 wherein said bias current means supplies to said semiconductor diode a bias current that is about one to four times greater than the stimulated emission threshold bias current.

14. A semiconductor optical amplifier as defined in claim 13 further including means for modulating said bias current with a modulation signal such that an optical signal passing through the amplifier is phase modulated by said modulation signal.

* * * * *